March 1, 1966 J. A. PATRICK 3,238,421

MODIFIED ELECTRONIC MODULE

Filed Sept. 18, 1964

JAMES A. PATRICK,
INVENTOR.

By [signature]
ATTORNEY.

United States Patent Office
3,238,421
Patented Mar. 1, 1966

3,238,421

MODIFIED ELECTRONIC MODULE

James A. Patrick, Montclair, Calif., assignor to General Dynamics Corporation (Pomona Division), Pomona, Calif., a corporation of Delaware Filed Sept. 18, 1964, Ser. No. 397,546
3 Claims. (Cl. 317—101)

This invention relates to transition devices or tabs, more particularly to transition devices or tabs for interconnecting electronic modules to lead wires or stranded conductors.

In the development, testing, and manufacture of encapsulated 3–D electronic modules it is often necessary to attach stranded conductors or the lead wires of tailoring components to the module terminals. With the adoption of serviceable welded interconnections for modules, removable terminal transition devices are required. An example of such a serviceable welded interconnection is disclosed in U.S. Patent 3,150,288 by Andrew E. Flanders et al. The serviceable welded interconnection terminals, for example, of the type disclosed in the above cited patent, present a flat surface, nearly flush with the surface of the module, the conductors being diffusion bonded to these terminals by a special process known as "surface welding." The nature of the "surface welding" process used in making these connections prohibits welding of stranded electrical wire and/or tailoring component leads directly to the terminals. Therefore, to overcome this problem, the present invention provides a simple and effective transition device or "go-between" so that the required conductors can be attached to the terminals.

Therefore, it is an object of this invention to provide a transition device.

A further object of the invention is to provide a transition device for electronic interconnections.

Another object of the invention is to provide transition tabs for interconnecting electronic modules to lead wires or stranded conductors.

Another object of the invention is to provide a device to enable the speedy and simple attachment of solid or stranded wires and component leads to either staple or nailhead types of serviceable welded terminals.

Other objects of the invention not specifically set forth above will become readily apparent from the following description and accompanying drawings wherein.

Figures 1, 2, 3, 4, 5, 6, 7:
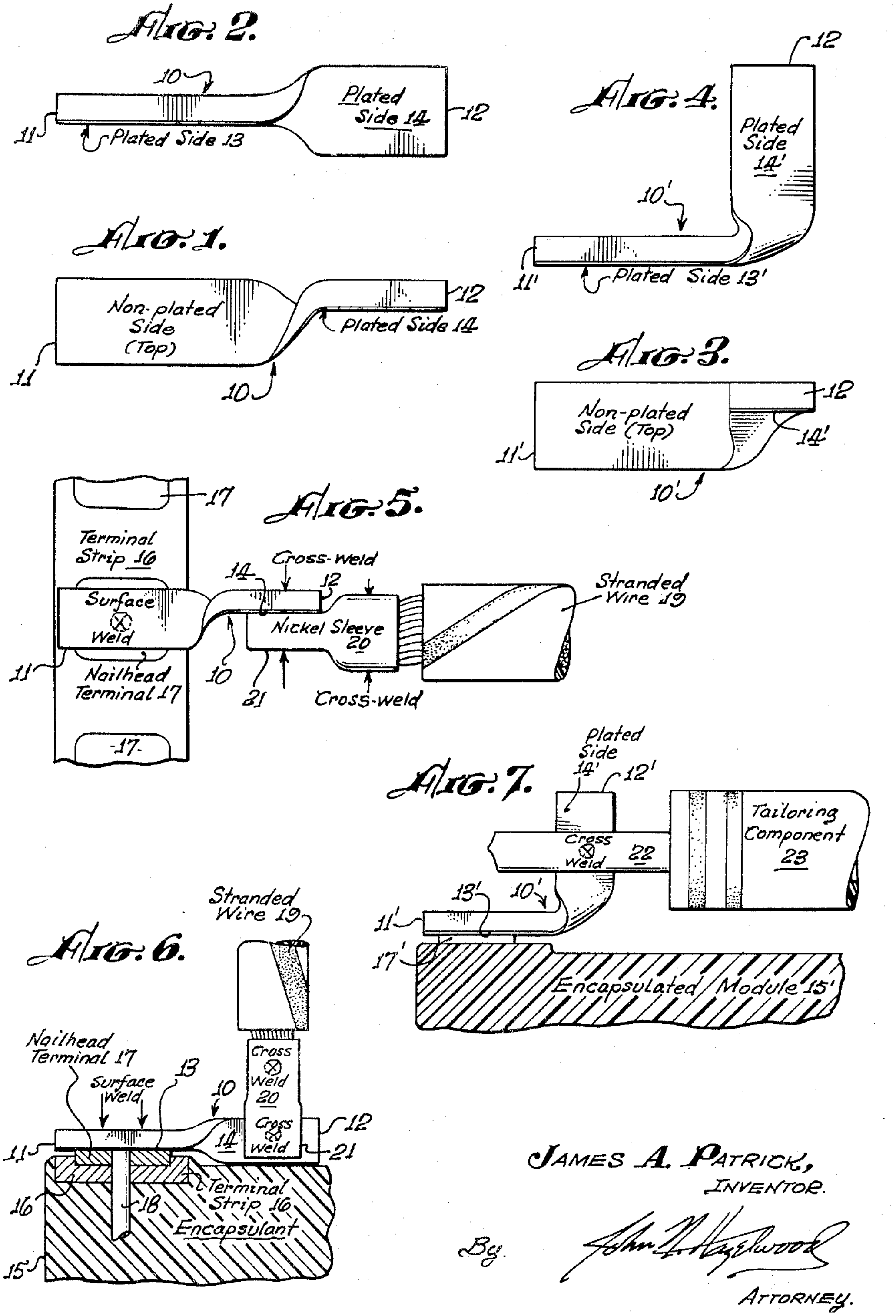
FIG. 1 is a plan view of one embodiment of the invention.
FIG. 2 is a side view of the FIG. 1 embodiment.
FIG. 3 is a plan view of another embodiment of the invention.
FIG. 4 is a side view of the FIG. 3 embodiment.
FIG. 5 is a plan view illustrating the FIG. 1 transition tab interconnecting a serviceable welded terminal with a stranded wire conductor.
FIG. 6 is a partial cross-sectional view of the FIG. 5 application incorporated on a module and with the conductor extending in a different direction.
FIG. 7 illustrates an interconnection utilizing the FIG. 3 embodiment of the invention.

Broadly, the invention relates to a technique for attaching stranded cable or component leads to the terminal points used to interconnect circuitry in a module structure. An extension tab or lug is formed by twisting and/or bending short sections of ribbon of the type described in the above cited U.S. patent, and is attached by the necessary surface welding process to the terminals of similar or different type of material. The cable or component leads can then be attached to these tabs or lugs by the preferred cross-welding process. The technique of this invention is necessary since it is not feasible to use the surface weld process to directly connect the cable or leads to module terminations using the serviceable ribbon type disclosed, for example, in the patent cited above wherein certain portions of the ribbon, which is constructed of material such as nickel, are the contact surface areas for the cable or component leads. The ribbon may be coated with material, such as gold, which is fusible at an appropriate temperature to facilitate securement by welding.

The transition device or "go-between" of this invention fulfills the requirements of such a device; namely, (1) high electrical conductivity, (2) high mechanical strength, (3) simplicity and rapidity of fabrication, (4) the use of normally available materials, (5) light weight, (6) small volume, (7) passage of required environmental test, and (8) easy replacement or repair. The high electrical conductivity and high mechanical strength are obtained by the use of cross-welding and surface-welding techniques. Fabrication of these devices requires only a 90° twist and/or a 90° bend, both of which may be performed by simple tooling or automatic machinery. Only one material is required for the tabs. The tab is attached to the serviceable terminal by surface welding, and the component lead or stranded conductor is attached to the tab by cross-welding.

FIGS. 1 and 2 illustrate a tab or lug generally indicated at 10 and comprising portions 11 and 12, portion 12 being twisted approximately 90° with respect to portion 11. Tab 10 may be of material such as nickel with surfaces 13 and 14 of portions 11 and 12, respectively, being plated with fusible material such as gold.

FIGS. 3 and 4 illustrate a tab or lug generally indicated at 10′ and comprising portions 11′ and 12′, portion 12′ being twisted approximately 90° and bent approximately 90° with respect to portion 11′. Tab 10′ may be of material such as nickel with surfaces 13′ and 14′ of portions 11′ and 12′, respectively, being plated with fusible material such as gold.

Referring now to FIGS. 5 and 6, an electronic module 15 is provided with a flat terminal strip 16 within which is mounted a plurality of terminals 17 of the "nailhead" type. Terminals 17 may be of any suitable material, or of the plated ribbon material disclosed in the above mentioned Patent 3,150,288. Terminals 17 are interconnected with encapsulated components within module 15 via portion 18 thereof. Tab 10 is positioned on a terminal 17 with the surface 13 of portion 11 abutting the upper surface of terminal 17. Tab 10 is surface-welded onto terminal 17 which in essence is a diffusion bond between the plated surface of the tab and the terminal. A stranded wire conductor 19 is cross-welded in conventional manner to a nickel sleeve 20. Nickel sleeve 20 is then flattened as indicated at 21 and cross-welded to the plated surface 14 of portion 12 of tab 10. Sticking of the welder electrode would result if it contacted the plated surface of tab 10.

An application of the FIG. 3 embodiment of the invention is illustrated in FIG. 7 wherein the surface 13′ of portion 11′ of tab 10′ is surface-welded to a terminal 17′ which is mounted on an encapsulated module 15′ in the manner described above with respect to FIGS. 5 and 6. A lead 22 of a tailoring component 23 is cross-welded to the plated surface 14′ of portion 12′ of tab 10′. Usually, the component 23 is positioned across module 15′ and attached at the opposite end thereof in the same manner.

Should repair or replacement of a module, tailoring component, or stranded wire be necessary, the tabs or lugs are removed by simply peeling them from the terminals due to the surface-weld of the plated material.

It has thus been shown that the present invention provides a simple and effective method of interconnecting a module utilizing a serviceable type terminal with lead wires or stranded conductors of material which is different than that of the terminal without hindering the quick removal and reassembly capabilities of the serviceable type terminal.

While the transition tab has been illustrated and described as having a plated surface, it is within the scope of this invention to utilize an alloy having the fusible capabilities for surface welding as described above.

Although specific embodiments of the invention have been illustrated and described, modifications will become apparent to those skilled in the art, and it is intended to cover in the appended claims all such modifications as come within the spirit and scope of the invention.

What I claim is:

1. In combination: an electronic module having a plurality of terminals, and a transition device interconnecting one of said module terminals with an external component; said transition device comprising a strip of conductive material having one surface thereof plated with fusible material, said strip of material having a portion thereof twisted approximately 90° with respect to the remainder of said strip, the plated surface of the transition device being joined to said terminal and to said external component.

2. The combination of elements defined in claim 1, wherein said strip of material is composed essentially of nickel and said fusible material is composed essentially of gold.

3. The combination of elements defined in claim 1, wherein said portion of said strip of material is additionally bent to define an approximately 90° angle with respect to the remainder of said strip.

References Cited by the Examiner

UNITED STATES PATENTS

| | | | |
|---|---|---|---|
| 3,118,016 | 1/1964 | Stephenson | 174—68.5 |
| 3,150,288 | 9/1964 | Flanders et al. | 174—52.6 X |

References Cited by the Applicant

UNITED STATES PATENTS

| | | |
|---|---|---|
| 2,945,083 | 7/1960 | Ganske et al. |

ROBERT K. SCHAEFER, *Primary Examiner.*

D. L. CLAY, *Assistant Examiner.*